(12) United States Patent
Lin et al.

(10) Patent No.: US 11,366,381 B2
(45) Date of Patent: Jun. 21, 2022

(54) MASK STRUCTURE AND MANUFACTURING METHOD THEREOF

(71) Applicant: Unimicron Technology Corp., Taoyuan (TW)

(72) Inventors: Pu-Ju Lin, Hsinchu (TW); Shih-Lian Cheng, New Taipei (TW); Yu-Hua Chen, Hsinchu (TW); Cheng-Ta Ko, Taipei (TW); Jui-Jung Chien, Hsinchu County (TW); Wei-Tse Ho, Taichung (TW)

(73) Assignee: Unimicron Technology Corp., Taoyuan (TW)

( * ) Notice: Subject to any disclaimer, the term of this patent is extended or adjusted under 35 U.S.C. 154(b) by 250 days.

(21) Appl. No.: 16/395,244

(22) Filed: Apr. 26, 2019

(65) Prior Publication Data

US 2019/0250502 A1    Aug. 15, 2019

Related U.S. Application Data

(62) Division of application No. 15/256,757, filed on Sep. 6, 2016, now Pat. No. 10,324,370.

(51) Int. Cl.
| | | |
|---|---|---|
| *B32B 37/00* | (2006.01) | |
| *G03F 1/50* | (2012.01) | |
| *H05K 3/06* | (2006.01) | |
| *H05K 3/24* | (2006.01) | |
| *H05K 3/00* | (2006.01) | |
| *H05K 3/10* | (2006.01) | |
| *H05K 3/12* | (2006.01) | |

(Continued)

(52) U.S. Cl.
CPC ............ *G03F 1/50* (2013.01); *G01K 7/24* (2013.01); *G01K 15/007* (2013.01); *G03F 7/2032* (2013.01); *G03F 7/2047* (2013.01); *H05K 3/0023* (2013.01); *H05K 3/064* (2013.01); *H05K 3/107* (2013.01); *H05K 3/1275* (2013.01); *H05K 3/182* (2013.01); *H05K 3/241* (2013.01); *H05K 3/422* (2013.01); *Y10T 29/302* (2015.01); *Y10T 29/49124* (2015.01)

(58) Field of Classification Search
CPC ...... C23C 18/1605; G02B 2006/12035; G02B 2006/12104; G02B 5/26; H05K 3/1275; H05K 3/182; Y10T 29/49124; Y10T 29/302; H01L 21/0268; H01L 21/0332; H01L 21/0337
USPC .......... 29/7.3, 825, 830, 826, 839, 846, 852, 29/17.3
See application file for complete search history.

(56) References Cited

U.S. PATENT DOCUMENTS 5,587,822 A * 12/1996 Lee .................. G02F 1/133788
                                                        349/124
7,580,190 B2 * 8/2009 Kim ...................... G02B 3/0012
                                                        359/620

(Continued)

*Primary Examiner* — Thiem D Phan
(74) *Attorney, Agent, or Firm* — JCIPRNET

(57) ABSTRACT

A mask structure and a manufacturing method of the mask structure are provided. The mask structure includes a transparent substrate, a patterned metal layer, and a plurality of microlens structures. The patterned metal layer is disposed on the transparent substrate and exposing a portion of the transparent substrate. The microlens structures are disposed on the transparent substrate exposed by a portion of the patterned metal layer and being in contact with the portion of the patterned metal layer.

4 Claims, 6 Drawing Sheets

(51) Int. Cl.
*H05K 3/18* (2006.01)
*H05K 3/42* (2006.01)
*G03F 7/20* (2006.01)
*G01K 7/24* (2006.01)
*G01K 15/00* (2006.01)

(56) References Cited

U.S. PATENT DOCUMENTS

| | | | |
|---|---|---|---|
| 8,728,712 B2 * | 5/2014 | Yabuki | G03F 7/031 |
| | | | 430/311 |
| 9,778,209 B2 * | 10/2017 | Nishimura | G03F 1/84 |
| 10,611,108 B2 * | 4/2020 | Wang | B29D 11/0048 |

* cited by examiner

MASK STRUCTURE AND MANUFACTURING METHOD THEREOF

CROSS-REFERENCE TO RELATED APPLICATIONS

This application is a divisional application of and claims the priority benefit of U.S. application Ser. No. 15/256,757, filed on Sep. 6, 2016, now allowed. The entirety of the above-mentioned patent application is hereby incorporated by reference herein and made a part of specification.

BACKGROUND OF THE INVENTION

Field of the Invention

The invention relates to a manufacturing method of a substrate and a mask structure and a manufacturing method thereof, and particularly relates to a manufacturing method of a circuit substrate and a mask structure and a manufacturing method thereof which can reduce a required frequency of exposure in an exposure process.

Description of Related Art

In current process technology of a circuit substrate, if it is desired to form conductive blind holes and circuit structures, at least two times of mask exposure processes are needed to define blind holes and intaglio patterns respectively. After that, the conductive blind holes and the circuit structures are formed in the blind holes and the intaglio patterns respectively by an electroplating method. Since two times of the mask exposure processes are required to form concaves (i.e., the blind holes and the intaglio patterns) with different depths in the prior art, the fabrication of a conventional circuit substrate is easy to have an issue of alignment accuracy. Additionally, since the two times of the mask exposure processes are required in the prior art, the required frequency of exposure in the exposure process can not be effectively reduced. Thus, the process time can not be shortened and the productivity can not be increased.

SUMMARY OF THE INVENTION

The invention provides a manufacturing method of a circuit substrate, which can effectively reduce the process time and increase the productivity.

The invention also provides a mask structure and a manufacturing method thereof, which can reduce the required frequency of exposure in the exposure process, so as to reduce the process time and increase the productivity.

The manufacturing method of the circuit substrate of the invention including the following manufacturing steps. A substrate is provided. A positive photoresist layer is coated on the substrate. Once exposure process is performed on the positive photoresist layer disposed on the substrate so as to simultaneously form concaves with at least two different depths.

According to an embodiment of the invention, the substrate includes a core layer, a first patterned circuit layer, and a second patterned circuit layer. The core layer includes a core dielectric layer, a first copper foil layer, and a second copper foil layer, where the first copper foil layer and the second copper foil layer are located at two opposite sides of the core dielectric layer respectively. The first patterned circuit layer is disposed on the first copper foil layer of the core layer, and exposes a portion of the first copper foil layer. The second patterned circuit layer is disposed on the second copper foil layer of the core layer, and exposes a portion of the second copper foil layer.

According to an embodiment of the invention, the positive photoresist layer includes a first positive photoresist layer and a second positive photoresist layer. The first positive photoresist layer covers the first patterned circuit layer and the first copper foil layer exposed by the first patterned circuit layer. The second positive photoresist layer covers the second patterned circuit layer and the second copper foil layer exposed by the second patterned circuit layer.

According to an embodiment of the invention, before once exposure process is performed on the positive photoresist layer disposed on the substrate, a program data is input to a direct imaging exposure machine. The program data includes a desired forming position and an adjustable exposure energy of each of the concaves.

According to an embodiment of the invention, the concaves with at least two different depths include at least one first blind hole extending from a first outer surface of the first positive photoresist layer relatively far away from the core layer to the first patterned circuit layer and at least one first intaglio pattern, and at least one second blind hole extending from a second outer surface of the second positive photoresist layer relatively far away from the core layer to the second patterned circuit layer and at least one second intaglio pattern.

According to an embodiment of the invention, the manufacturing method of the circuit substrate further includes performing once development process and once baking process on the positive photoresist layer sequentially so as to cure the positive photoresist layer after performing the exposure process on the positive photoresist layer disposed on the substrate so as to simultaneously form the concaves with at least two different depths. After curing the positive photoresist layer, a first seed layer is formed in the first blind hole and the first intaglio pattern, and a second seed layer is formed in the second blind hole and the second intaglio pattern. The first seed layer and the second seed layer are used as electroplating seed layers to form a conductive material layer by an electroplating method. A portion of the conductive material layer is removed to expose the first outer surface of the first positive photoresist layer and the second outer surface of the second positive photoresist layer. A plurality of conductive blind holes are formed in the first blind hole and the second blind hole, and a plurality of circuit patterns are formed in the first intaglio pattern and the second intaglio pattern.

According to an embodiment of the invention, the substrate includes a glass substrate and a metal layer. The metal layer is disposed on the glass substrate, where the metal layer includes one of a titanium-copper composite layer, copper, titanium, palladium, silver, nickel, tin, etc., or a combination thereof.

According to an embodiment of the invention, the manufacturing method of the circuit substrate further includes providing a mask structure above the positive photoresist layer before performing the exposure process on the positive photoresist layer disposed on the substrate. The mask structure includes a transparent substrate, a patterned metal layer, and a plurality of microlens structures. The patterned metal layer is disposed on the transparent substrate and exposes a portion of the transparent substrate, so as to define at least one first exposure region. The microlens structures are disposed on the transparent substrate exposed by a portion of the patterned metal layer, so as to define at least one second exposure region.

According to an embodiment of the invention, when the exposure process is performed on the positive photoresist layer disposed on the substrate, a depth of the concave corresponding to the first exposure region is larger than a depth of the concave corresponding to the second exposure region.

According to an embodiment of the invention, the depth of the concave corresponding to the first exposure region is equal to a distance between an outer surface of the positive photoresist layer relatively far away from the glass substrate and the metal layer.

According to an embodiment of the invention, a depth of the concaves and a radius of curvature of the microlens structures are in a proportional relationship.

The mask structure of the invention includes a transparent substrate, a patterned metal layer, and a plurality of microlens structures. The patterned metal layer is disposed on the transparent substrate and exposes a portion of the transparent substrate. The microlens structures are disposed on the transparent substrate exposed by a portion of the patterned metal layer and are in contact with the portion of the patterned metal layer.

According to an embodiment of the invention, a material of the patterned metal layer includes one of chromium, copper, titanium, palladium, silver, nickel, tin, etc., or a combination thereof.

According to an embodiment of the invention, a material of the transparent substrate includes glass, Ajinomoto (ABF), benzocyclo-buthene (BCB), liquid crystal polymers (LCP), poly-imide (PI), poly-phenylene ether (PPE), poly-tetra-fluoroethylene (PTFE), FR4, FR5, bistmaleimide triazine (BT), aramide, epoxy resins, or glass fibers.

The manufacturing method of the mask structure of the invention including the following manufacturing steps. A transparent substrate is provided. A patterned metal layer is disposed on the transparent substrate, where the patterned metal layer is disposed on the transparent substrate and exposes a portion of the transparent substrate. A plurality of microlens structures are formed on the transparent substrate exposed by a portion of the patterned metal layer.

According to an embodiment of the invention, the step of forming the microlens structures on the transparent substrate exposed by the portion of the patterned metal layer includes providing a mold, where the mold has a plurality of convex portions. An organic polymer material is attached to the convex portions of the mold. The convex portions of the mold attached with the organic polymer material is used to form the microlens structures on the transparent substrate exposed by the portion of the patterned metal layer by a contact printing method.

According to an embodiment of the invention, a radius of curvature and a focus exposure depth of the microlens structures are in a proportional relationship.

According to an embodiment of the invention, the step of forming the microlens structures on the transparent substrate exposed by the portion of the patterned metal layer includes forming an organic polymer material on the transparent substrate exposed by the portion of the patterned metal layer using an inkjet printing method. A heat curing process is performed on the organic polymer material to form the microlens structures.

According to an embodiment of the invention, a temperature of the heat curing process is between 120 degrees and 180 degrees.

According to an embodiment of the invention, a radius of curvature and a focus exposure depth of the microlens structures are in a proportional relationship.

Based on the above, the manufacturing method of the circuit substrate of the invention is capable of performing once exposure process on the positive photoresist layer disposed on the substrate to simultaneously form concaves with at least two different depths. Thus, the manufacturing method of the circuit substrate of the invention can reduce the required frequency of exposure in the exposure process, so as to reduce the process time and increase the productivity.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
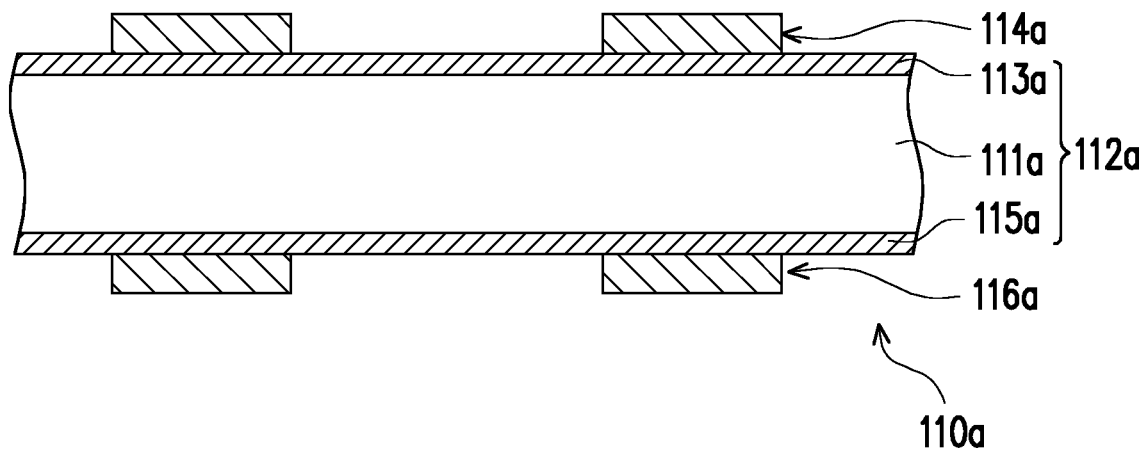
FIG. 1A to FIG. 1F are schematic cross-sectional diagrams of a manufacturing method of a circuit substrate according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1F are schematic cross-sectional diagrams of a manufacturing method of a circuit substrate according to an embodiment of the invention. Regarding to the manufacturing method of the circuit substrate of the embodiment, first, referring to FIG. 1A, a substrate 110a is provided. The substrate 110a includes a core layer 112a, a first patterned circuit layer 114a, and a second patterned circuit layer 116a. The core layer 112a includes a core dielectric layer 111a, a first copper foil layer 113a, and a second copper foil layer 115a, where the first copper foil layer 113a and the second copper foil layer 115a are located at two opposite sides of the core dielectric layer 111a respectively, and completely cover the two opposite sides of the core dielectric layer 111a respectively. The first patterned circuit layer 114a is disposed on the first copper foil layer 113a of the core layer 112a, and exposes a portion of the first copper foil layer 113a. The second patterned circuit layer 116a is disposed on the second copper foil layer 115a of the core layer 112a, and exposes a portion of the second copper foil layer 115a.

Figure 1B:
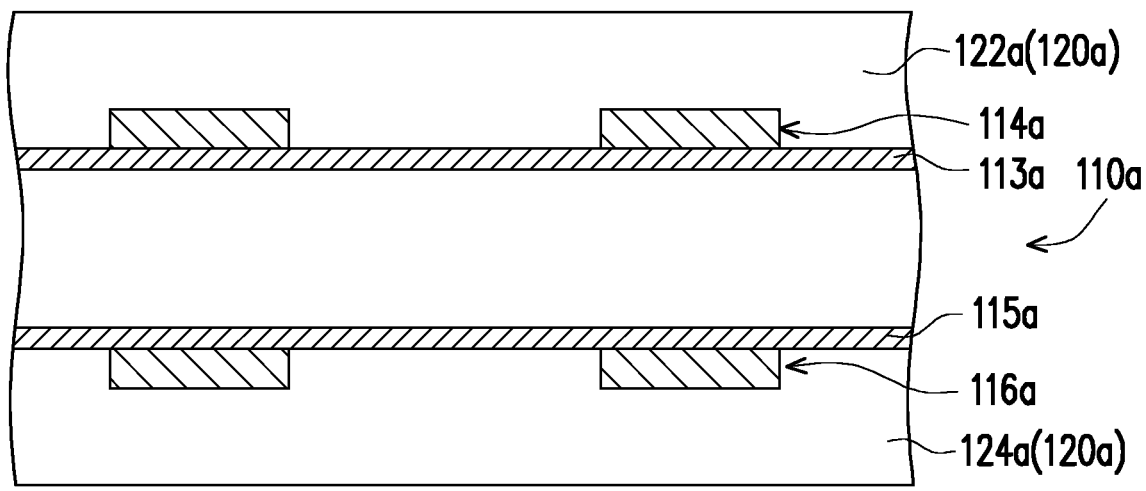

Then, referring to FIG. 1B, a positive photoresist layer 120a is coated on the substrate 110a. Specifically, the positive photoresist layer 120a includes a first positive photoresist layer 122a and a second positive photoresist layer 124a. The first positive photoresist layer 122a covers the first patterned circuit layer 114a and the first copper foil layer 113a exposed by the first patterned circuit layer 114a. The second positive photoresist layer 124a covers the second patterned circuit layer 116a and the second copper foil layer 115a exposed by the second patterned circuit layer 116a.

Figure 1C:
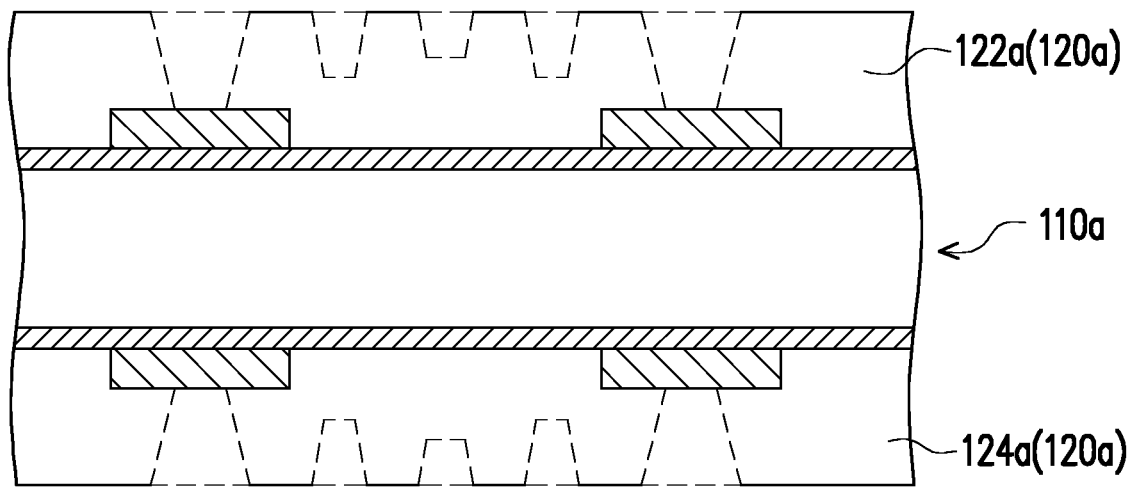

Then, referring to FIG. 1C, a program data is input to a direct imaging exposure machine (not shown), where the program data includes a desired forming position (the dotted line pattern as shown in FIG. 1C) and an adjustable exposure energy of each of concaves. Herein, the direct imaging exposure machine embodies a maskless digital exposure machine, and a desired depth of the concave can be formed in where the concave is desired to be formed by an inputting program method.

Figure 1D:
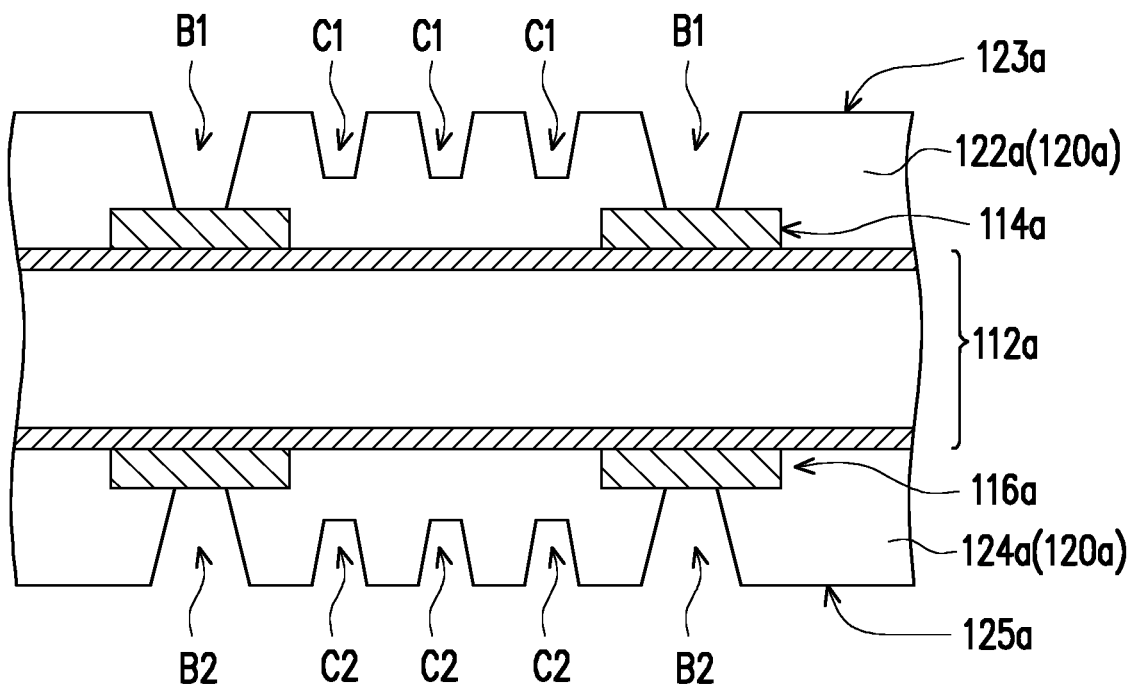

Then, referring to FIG. 1D, once exposure process is performed on the positive photoresist layer 120a disposed on the substrate 110a so as to simultaneously form concaves with at least two different depths. Specifically, the concaves herein include at least one first blind hole B1 (two are schematically depicted in FIG. 1D) extending from a first outer surface 123a of the first positive photoresist layer 122a relatively far away from the core layer 112a to the first patterned circuit layer 114a and at least one first intaglio pattern C1 (three are schematically depicted in FIG. 1D), and at least one second blind hole B2 (two are schematically depicted in FIG. 1D) extending from a second outer surface 125a of the second positive photoresist layer 124a relatively far away from the core layer 112a to the second patterned circuit layer 116a and at least one second intaglio pattern C2 (three are schematically depicted in FIG. 1D). As shown in FIG. 1D, a depth of the first blind hole B1 is larger than a depth of the first intaglio pattern C1, and a depth of the second blind hole B2 is larger than a depth of the second intaglio pattern C2.

That is, the embodiment adopts the maskless digital exposure machine to form the blind holes (i.e., the first blind hole B1 and the second blind hole B2) with different depths and the intaglio patterns (i.e., the first intaglio pattern C1 and the second intaglio pattern C2) by once exposure method. Thus, the required frequency of exposure in the exposure process can be reduced, so as to reduce the process time and increase the productivity.

Then, referring to FIG. 1D, once development process and once baking process are performed on the positive photoresist layer 120 sequentially so as to cure the positive photoresist layer 120.

Figure 1E:
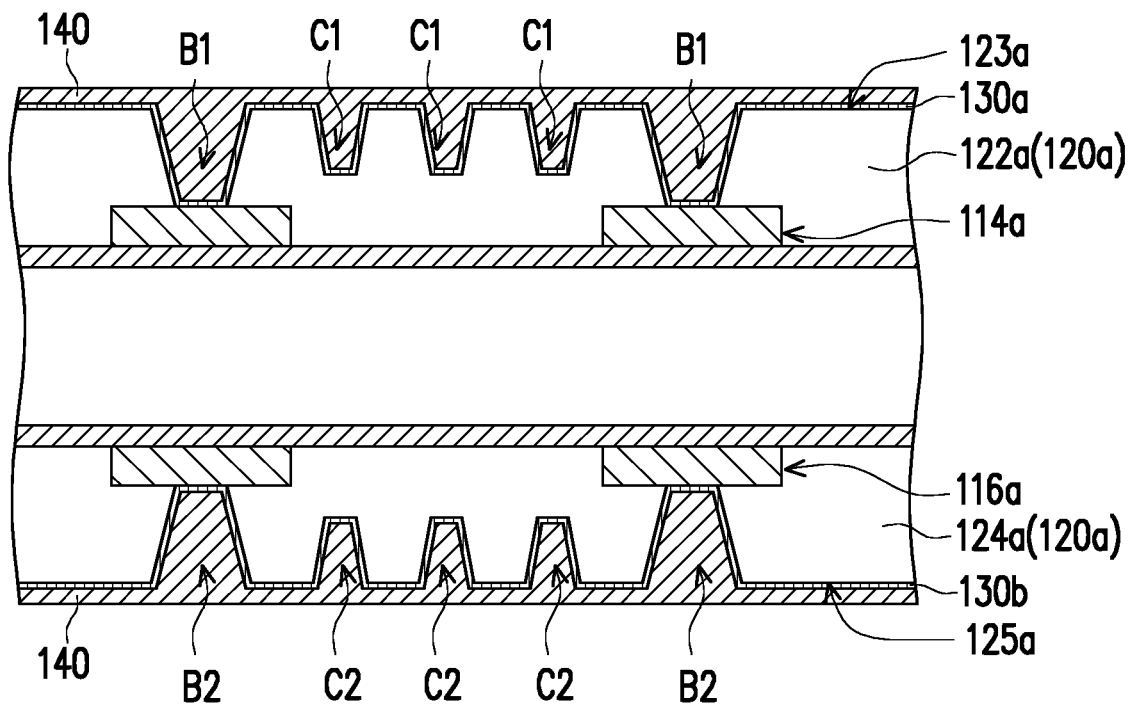

Then, referring to FIG. 1E, a first seed layer 130a is formed in the first blind hole B1 and the first intaglio pattern C1, and a second seed layer 130b is formed in the second blind hole B2 and the second intaglio pattern C2. Herein, the first seed layer 130a completely covers inner walls of the first blind hole B1 and inner walls of the first intaglio pattern C1, and is in direct contact with the first patterned circuit layer 114a exposed by the first positive photoresist layer 122a and the first outer surface 123a of the first positive photoresist layer 122a. The second seed layer 130b completely covers inner walls of the second blind hole B2 and inner walls of the second intaglio pattern C2, and is in direct contact with the second patterned circuit layer 116a exposed by the second positive photoresist layer 124a and the second outer surface 125a of the second positive photoresist layer 124a.

After that, referring to FIG. 1E, the first seed layer 130a and the second seed layer 130b are used as electroplating seed layers to form a conductive material layer 140 by an electroplating method. Herein, the conductive material layer 140 is completely filled in the first blind hole B1, the second blind hole B2, the first intaglio pattern C1, and the second intaglio pattern C2, and covers the first outer surface 123a of the first positive photoresist layer 122a and the second outer surface 125a of the second positive photoresist layer 124a.

Figure 1F:
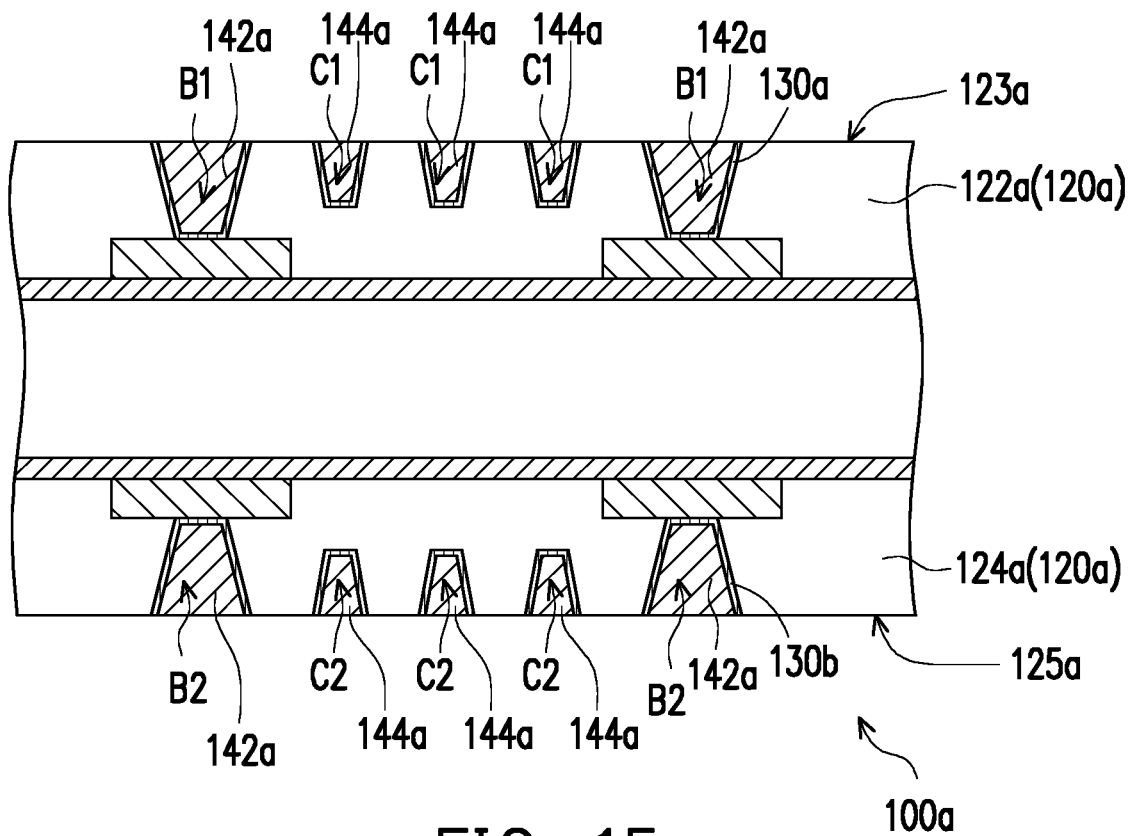

At last, referring to FIG. 1E and FIG. 1F at the same time, a portion of the conductive material layer 140, a portion of the first seed layer 130a, and a portion of the second seed layer 130b are removed to expose the first outer surface 123a of the first positive photoresist layer 122a and the second outer surface 125a of the second positive photoresist layer 124a. A plurality of conductive blind holes 142a are formed in the first blind hole B1 and the second blind hole B2, and a plurality of circuit patterns 144a are formed in the first intaglio pattern C1 and the second intaglio pattern C2. Until now, the fabrication of the circuit substrate 100a has been completed.

It should be mentioned that, the core layer 112a can be selectively removed in the subsequent application, so as to form a padless circuit substrate, which is still within the scope of the invention.

It should be noted that, the component notations and partial details of the structures hereinafter provided in the following embodiments can be the same as or similar to the previous embodiment, wherein the same notations represent the same or similar components while the repeated same details are omitted in the following embodiments, which can refer to the previous embodiment.

Figure 2A:
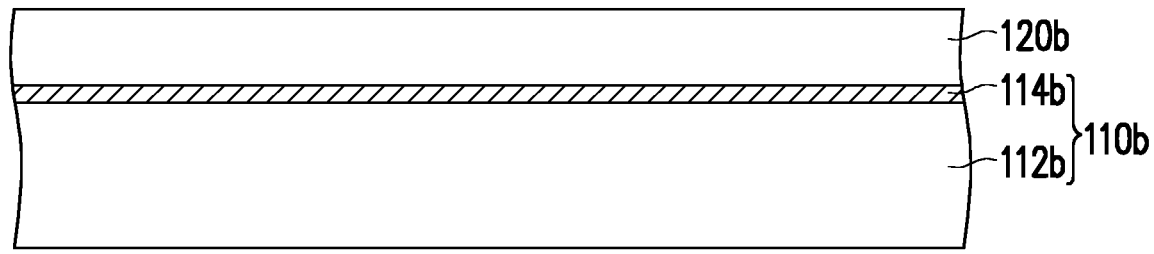
FIG. 2A to FIG. 2C are schematic cross-sectional diagrams of a manufacturing method of a circuit substrate according to another embodiment of the invention.
Figure 2B:
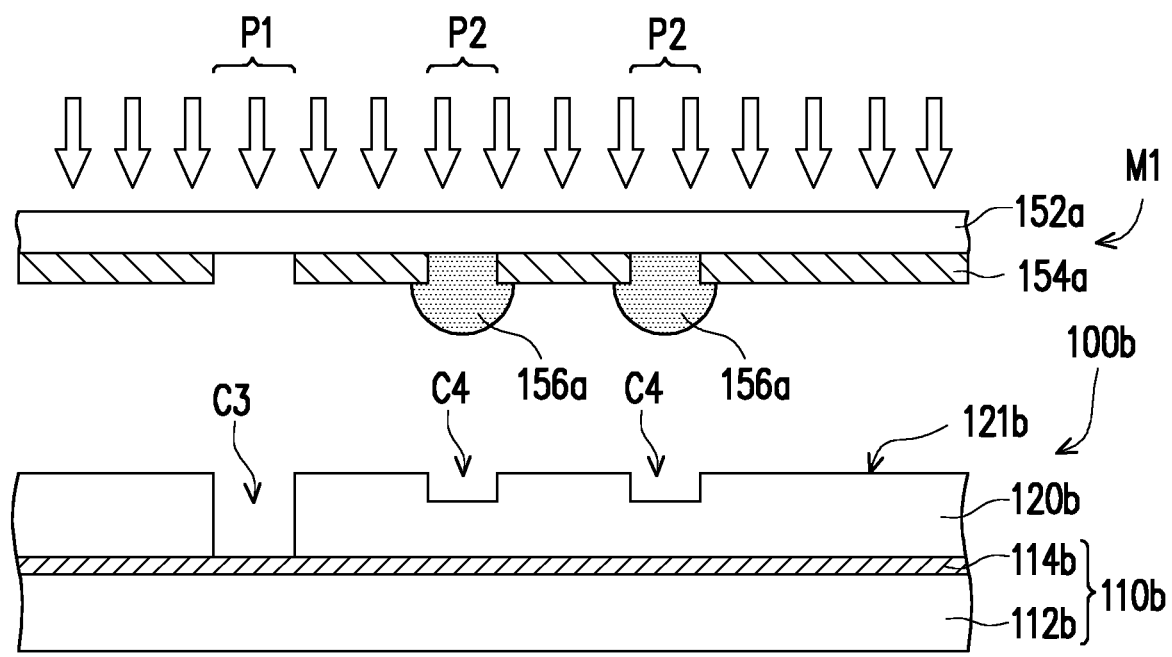
Figure 2C:
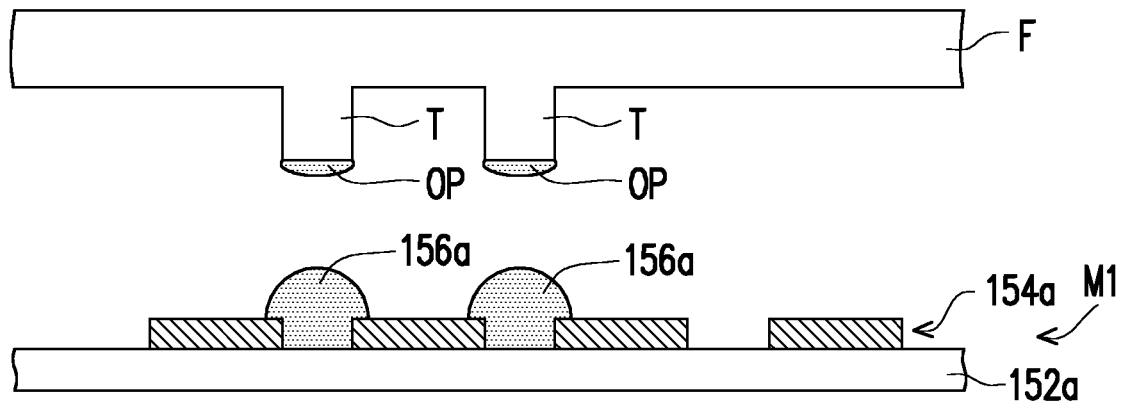

FIG. 2A to FIG. 2C are schematic cross-sectional diagrams of a manufacturing method of a circuit substrate according to another embodiment of the invention. Referring to FIG. 2A, the manufacturing method of the circuit substrate of the embodiment is similar to the manufacturing method of the circuit substrate of FIG. 1A to FIG. 1F, and the difference between the two is that, a substrate 110b of the embodiment includes a glass 7 substrate 112b and a metal layer 114b, where the metal layer 114b is disposed on the glass substrate 112b, and the metal layer 114b is one of a titanium-copper composite layer, copper, titanium, palladium, silver, nickel, tin, etc., or a combination thereof, for example.

Then, referring to FIG. 2B, a mask structure M1 is provided above a positive photoresist layer 120b, where the mask structure M1 includes a transparent substrate 152a, a patterned metal layer 154a, and a plurality of microlens structures 156a. The patterned metal layer 154a is disposed on the transparent substrate 152a and exposes a portion of the transparent substrate 152a, so as to define at least one first exposure region P1 (one is schematically depicted in FIG. 2B). The microlens structures 156a are disposed on the transparent substrate 152a exposed by a portion of the patterned metal layer 154a, so as to define at least one second exposure region P2 (two are schematically depicted in FIG. 2B). Herein, a light transmittance of the first exposure region P1 is more than a light transmittance of the second exposure region P2.

As shown in FIG. 2C, the step of forming the mask structure M1 includes the following steps. First, the transparent substrate 152a is provided, where a material of the transparent substrate 152a includes glass, Ajinomoto (ABF), benzocyclo-buthene (BCB), liquid crystal polymers (LCP), poly-imide (PI), poly-phenylene ether (PPE), poly-tetra-fluoroethylene (PTFE), FR4, FR5, bistmaleimide triazine (BT), aramide, epoxy resins, or glass fibers. Then, the patterned metal layer 154a is formed on the transparent substrate 152a, where the patterned metal layer 154a is disposed on the transparent substrate 152a and exposes a portion of the transparent substrate 152a. A material of the patterned metal layer 154a includes one of chromium, copper, titanium, palladium, silver, nickel, tin, etc., or a combination thereof. After that, the plurality of the microlens structures 156a are formed on the transparent substrate 152a exposed by the portion of the patterned metal layer 154a. Herein, the step of forming the microlens structures 156a on the transparent substrate 152a exposed by the portion of the patterned metal layer 154a including the following steps. First, a mold F is provided, where the mold F has a plurality of convex portions T. Then, an organic polymer material OP is attached to the convex portions T of the mold F. After that, the convex portions T of the mold F attached with the organic polymer material OP is used to form the microlens structures 156a on the transparent substrate 152a exposed by the portion of the patterned metal layer 154a by a contact printing method.

Figure 2D:
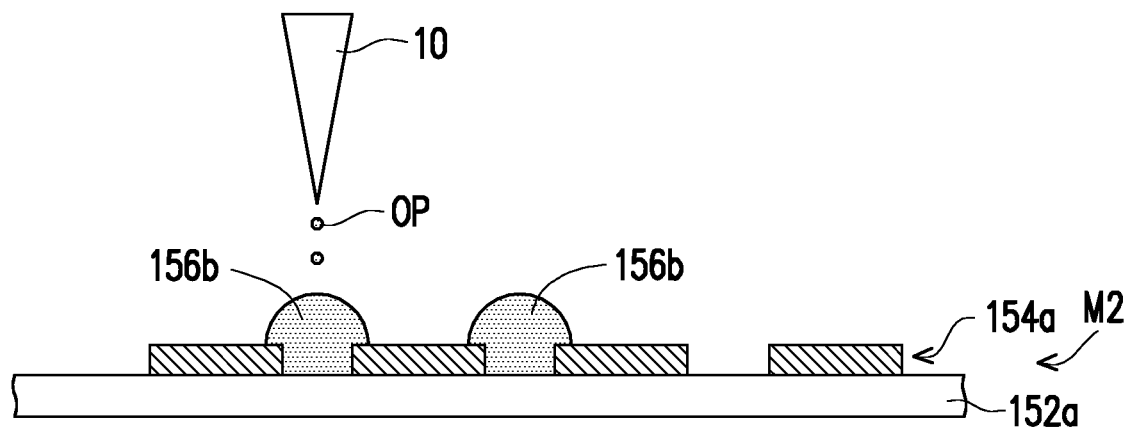
FIG. 2D is a schematic cross-sectional diagram of a manufacturing method of a mask structure according to another embodiment of the invention.

It should be mentioned that, the invention does not limit the manufacturing method of the mask structure M1. In other embodiments, referring to FIG. 2D, a mask structure M2 may also be formed by forming the organic polymer material OP on the transparent substrate 152a exposed by the portion of the patterned metal layer 154a by an inkjet printing method through a nozzle 10. After that, a heat curing process is performed on the organic polymer material OP to form the microlens structures 156b. Herein, a temperature of the heat curing process is between 120 degrees and 180 degrees, for example. Preferably, between 125 degrees and 140 degrees, or between 150 degrees and 160 degrees. The heating temperature can be changed according to a formulation of the organic polymer material OP, so as to form the microlens structures 156b with different radiuses of curvature.

After that, referring to FIG. 2B, once exposure process is performed on the positive photoresist layer 120b disposed on the substrate 110b so as to simultaneously form concaves with at least two different depths. Specifically, when the exposure process is performed on the positive photoresist layer 120b disposed on the substrate 110b, the light transmittance of the first exposure region P1 is larger than the light transmittance of the second exposure region P2. Thus, a depth of a concave C3 corresponding to the first exposure region P1 is larger than a depth of a concave C4 corresponding to the second exposure region P2. Herein, the depth of the concave C3 corresponding to the first exposure region P1 is equal to a distance between an outer surface 121b of the positive photoresist layer 120b relatively far away from the glass substrate 112b and the metal layer 114b. Until now, the fabrication of the circuit substrate 100b has been completed.

Since the embodiment uses the microlens structures 156a to make the mask structure M1 have the regions (i.e., the first exposure region P1 and the second exposure region P2) with at least two different light transmittances, only once exposure process is required in the manufacturing method of the circuit substrate 100b of the embodiment, and the concaves (i.e., the concaves C3 and C4) with different depths can be obtained simultaneously. Thus, the manufacturing method of the circuit substrate 100b of the embodiment can reduce the required frequency of exposure in the exposure process, so as to reduce the process time and increase the productivity.

Figure 2E:
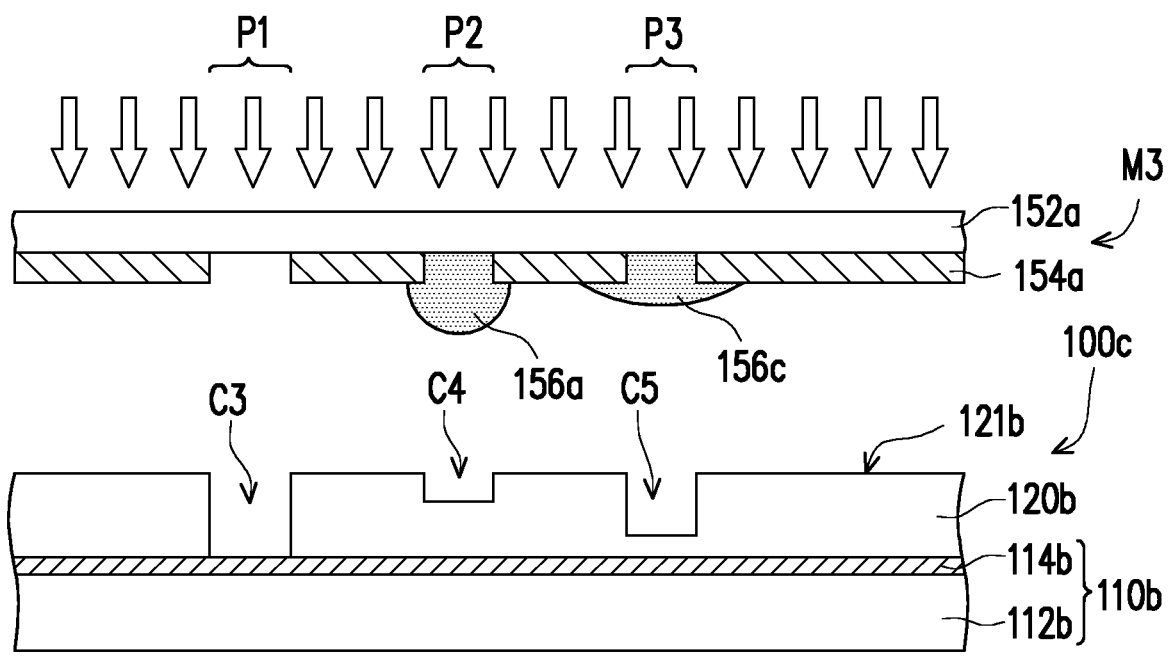
FIG. 2E is a schematic cross-sectional diagrams of some steps of a manufacturing method of a circuit substrate according to a further embodiment of the invention.

Particularly, the depth of the concaves and the radius of curvature of the microlens structures of the embodiment are substantially in a proportional relationship. Referring to FIG. 2E, the main difference between the manufacturing method of a circuit substrate 100c of the embodiment and the manufacturing method of the circuit substrate 100b of FIG. 2B is that, a mask structure M3 of the embodiment has microlens structures 156a and 156c with two different radiuses of curvature, where the radius of curvature of the microlens structure 156c is larger than the radius of curvature of the microlens structure 156a. Thus, a depth of a concave C5 formed after the exposure is substantially larger than the depth of the concave C4. Specifically, the radius of curvature of the microlens structure 156c is larger compared with the radius of curvature of the microlens structure 156a. That is, a focus exposure depth of the microlens structure 156c is longer compared with a focus exposure depth of the microlens structure 156a. Thus, when light passes through the microlens structure 156c and microlens structure 156a respectively, less light is absorbed by the microlens structure 156c. That is, more light is irradiated onto the positive photoresist layer 120b, so as to form the concave C5 with a greater depth. On the other hand, more light is absorbed by the microlens structure 156a. That is, less light is irradiated onto the positive photoresist layer 120b, so as to form the concave C4 with a shallower depth. In short, the depths of the concaves C4 and C5 and the radiuses of curvature of the microlens structures 156a and 156c are in a proportional relationship, and the radiuses of curvature and one focus exposure depth of the microlens structures 156a and 156c are in a proportional relationship. Herein, the microlens structures 156a and 156c can be formed on the transparent substrate 152a by a direct printing method or an inkjet printing method, and is not limited thereto.

In summary, the manufacturing method of the circuit substrate of the invention can perform once exposure process on the positive photoresist layer disposed on the substrate, and the concaves with at least two different depths can be simultaneously formed. Thus, the manufacturing method of the circuit substrate of the invention can reduce the required frequency of exposure in the exposure process, so as to reduce the process time and increase the productivity.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A mask structure, comprising:
a transparent substrate;
a patterned metal layer having an upper surface and an opposite lower surface, wherein the lower surface is disposed on the transparent substrate and the patterned metal layer exposes a portion of the transparent substrate; and
a plurality of microlens structures, disposed on the transparent substrate exposed by a portion of the patterned metal layer and being in contact with a portion of the upper surface of the patterned metal layer and the portion of the transparent substrate exposed by the patterned metal layer, wherein a radius of curvature and a focus exposure depth of the microlens structures are in a proportional relationship.

2. The mask structure according to claim 1, wherein a material of the patterned metal layer comprises one of chromium, copper, titanium, palladium, silver, nickel, tin, or a combination thereof.

3. The mask structure according to claim 1, wherein a material of the transparent substrate comprises glass, Ajinomoto (ABF), benzocyclo-buthene (BCB), liquid crystal polymers (LCP), poly-imide (PI), poly-phenylene ether (PPE), poly-tetra-fluoroethylene (PTFE), FR4, FR5, bistmaleimide triazine (BT), aramide, epoxy resins, or glass fibers.

4. A manufacturing method of a mask structure, comprising:

providing a transparent substrate;

forming a patterned metal layer on the transparent substrate, wherein the patterned metal layer has an upper surface and an opposite lower surface, the lower surface is disposed on the transparent substrate and the patterned metal layer exposes a portion of the transparent substrate; and after the step of forming the patterned metal layer, forming a plurality of microlens structures on the transparent substrate exposed by a portion of the patterned metal layer and being in contact with a portion of the upper surface of the patterned metal layer, wherein a radius of curvature and a focus exposure depth of the microlens structures are in a proportional relationship, wherein the step of forming the microlens structures on the transparent substrate exposed by the portion of the patterned metal layer, comprising:

forming an organic polymer material on the transparent substrate exposed by the portion of the patterned metal layer using an inkjet printing method; and performing a heat curing process on the organic polymer material to form the microlens structures, wherein a temperature of the heat curing process is between 120 degrees and 180 degrees.

* * * * *